United States Patent
Hon et al.

(10) Patent No.: US 12,507,489 B2
(45) Date of Patent: Dec. 23, 2025

(54) PHOTODETECTOR WITH ROTATED ELECTRIC FIELD

(71) Applicant: Cisco Technology, Inc., San Jose, CA (US)

(72) Inventors: Kam Yan Hon, Irvine, CA (US); Fatemeh Rezaeifar Bayat, Mission Viejo, CA (US); Attila Mekis, Carlsbad, CA (US); Gianlorenzo Masini, Carlsbad, CA (US)

(73) Assignee: Cisco Technology, Inc., San Jose, CA (US)

( * ) Notice: Subject to any disclaimer, the term of this patent is extended or adjusted under 35 U.S.C. 154(b) by 455 days.

(21) Appl. No.: 18/063,540

(22) Filed: Dec. 8, 2022

(65) Prior Publication Data

US 2024/0194813 A1 Jun. 13, 2024

(51) Int. Cl.
*H10F 30/221* (2025.01)
*H10F 71/00* (2025.01)

(52) U.S. Cl.
CPC ....... *H10F 30/2218* (2025.01); *H10F 71/127* (2025.01)

(58) Field of Classification Search
CPC .. H10F 30/2218; H10F 71/127; H10F 30/223; H10F 71/121; H10F 77/14; H01L 31/1804; H01L 31/105; H01L 31/0352; H01L 31/1037; H01L 31/184; H01L 31/022408; H01L 31/028
See application file for complete search history.

(56) References Cited

U.S. PATENT DOCUMENTS

| | | | | |
|---|---|---|---|---|
| 7,397,101 | B1* | 7/2008 | Masini | H10F 30/223 |
| | | | | 257/656 |
| 10,546,963 | B2* | 1/2020 | Hon | H10F 77/241 |
| 11,049,851 | B2* | 6/2021 | Hon | G02B 6/12007 |
| 11,101,400 | B2* | 8/2021 | Masini | H10F 55/15 |
| 11,393,939 | B2* | 7/2022 | Chern | G01J 1/42 |
| 11,393,940 | B2* | 7/2022 | Chern | H10F 77/206 |
| 11,404,590 | B2* | 8/2022 | Chern | H10F 30/223 |

(Continued)

OTHER PUBLICATIONS

Wang, B., Mu, J. High-speed Si—Ge avalanche photodiodes. PhotoniX 3, 8 (2022). https://doi.org/10.1186/s43074-022-00052-6.

(Continued)

*Primary Examiner* — Earl N Taylor
(74) *Attorney, Agent, or Firm* — Patterson + Sheridan, LLP

(57) ABSTRACT

A photodetector includes a substrate, an absorber, a first doped region, and a second doped region. The absorber includes a first region and a second region that is more heavily doped than the first region. The first doped region is positioned on the substrate such that the first doped region contacts the second region of the absorber. A portion of the first doped region is positioned between the absorber and the substrate. The second doped region is positioned on the substrate such that the second doped region contacts the first region of the absorber rather than the second region of the absorber. A portion of the second doped region is positioned between the absorber and the substrate. The portion of the second doped region extends across a majority of a width of the absorber.

17 Claims, 11 Drawing Sheets

(56) References Cited

U.S. PATENT DOCUMENTS

| | | | |
|---|---|---|---|
| 11,735,574 B2* | 8/2023 | Hon | G02B 6/0006 257/98 |
| 2010/0207683 A1* | 8/2010 | Ho | H10D 10/311 327/534 |
| 2016/0155884 A1* | 6/2016 | Hon | H10F 30/221 257/184 |
| 2016/0299363 A1* | 10/2016 | Wei | H01L 21/3215 |
| 2018/0358342 A1* | 12/2018 | Hon | G02B 6/12007 |
| 2020/0161482 A1* | 5/2020 | Hon | H10F 30/221 |
| 2020/0313021 A1* | 10/2020 | Fujikata | H10F 77/14 |
| 2021/0091239 A1* | 3/2021 | Chern | H10F 30/223 |
| 2021/0217785 A1* | 7/2021 | Takeda | H10F 39/103 |
| 2021/0225922 A1* | 7/2021 | Na | H10F 10/17 |
| 2022/0013680 A1* | 1/2022 | Srinivasan | H10F 30/225 |
| 2023/0378386 A1* | 11/2023 | Gureev | H10F 30/2218 |
| 2024/0038919 A1* | 2/2024 | Masini | H10F 77/14 |
| 2024/0038920 A1* | 2/2024 | Rezaeifar Bayat | H10F 77/14 |
| 2024/0154053 A1* | 5/2024 | Masini | H10F 30/222 |
| 2024/0162366 A1* | 5/2024 | Masini | H10F 30/2255 |
| 2024/0194813 A1* | 6/2024 | Hon | H10F 71/127 |

OTHER PUBLICATIONS

Benedikovic et al., Silicon-germanium receivers for short-waveinfrared optoelectronics and communications High-speed silicon-germanium receivers (invited review), Nanophotonics, 2020, 10/1515/nanoph-2020-0547.

N. K. Hon, S. Sahni, A. Mekis and G. Masini, "Design and performance of high-speed Ge-on-Si waveguide photodiodes," 2017 IEEE 14th International Conference on Group IV Photonics (GFP), 2017, pp. 177-178, doi: 10.1109/GROUP4.2017.8082254.

S. Sahni, N.K. Hon, G. Masini, The Dual-Heterojunction Ge on Si Photodetector (2014 Meeting Abstracts), MA2014-02 1841.

U.S. Appl. No. 18/054,871, filed Nov. 11, 2022.

U.S. Appl. No. 17/815,115, filed Jul. 26, 2022.

* cited by examiner

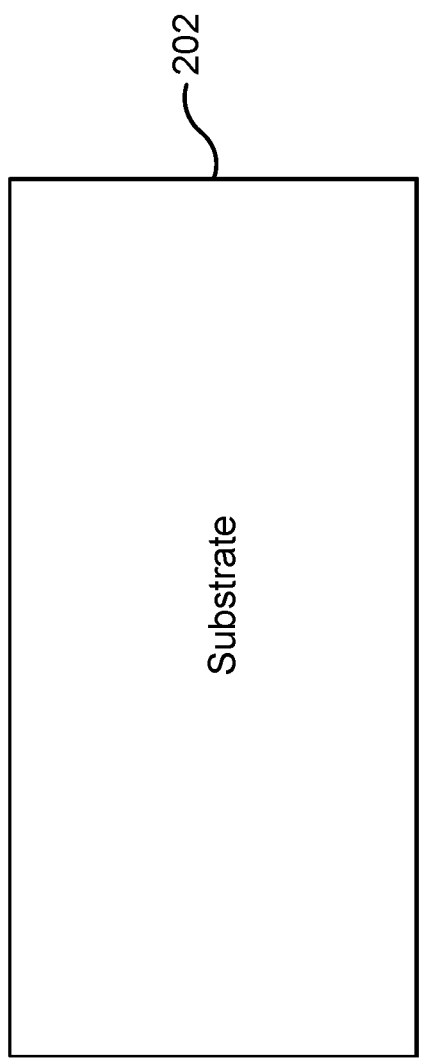

PHOTODETECTOR WITH ROTATED ELECTRIC FIELD

TECHNICAL FIELD

Embodiments presented in this disclosure generally relate to optical communications. More specifically, embodiments disclosed herein a photodetectors.

BACKGROUND

High-speed optical transceivers are prevalent in datacenters. Germanium (Ge) waveguide photodetectors are key elements of these transceivers, implementing the functionality of converting the optical data streams into the electrical domain. To properly accomplish this functionality, the photodetectors should be efficient and fast.

The response speed of Ge photodetectors may be limited by the amount of time it takes for photogenerated carriers to travel across the absorption region of the photodetector and to reach the electrodes to deliver the photocurrent response, which may also be referred to as the transit time. The transit time may be improved by reducing the distance that the photogenerated carriers travel. For example, the width of the absorption region may be reduced to reduce the travel distance. Process limitations, however, limit how much the width of the absorption region may be reduced. Thus, these process limitations may limit the speed of the photodetector, which may limit the types of applications in which the photodetector may be used. As the speed of photodetectors in optical transceivers increases to support faster data rates, these process constraints become a larger hurdle to overcome to realize the faster speeds.

For example, historically, the photodetector bandwidth has been targeted to be close to 70% of a desired data rate. With existing optical transceivers operating at speeds as high as 56 Gigabaud/second, a bandwidth in excess of 40 GHz may be needed. In addition, the move to pulse amplitude modulation format and the associated challenges in transimpedance amplifier design have increased even further the pressure on photodetector bandwidth.

As discussed above, bandwidth in photodetectors is limited by transit time. This time depends on the free carrier speed and can be reduced by increasing the electric field, up to the point where emission of optical phonons limits the velocity to its saturation value. Typically, carriers move at saturation velocity, so the only mechanism available to speed up a photodetector is to shrink the length of the path photogenerated carriers have to cover to reach the electrodes. However, process limitations impose limits to the scalability of drift length in the current architecture used for photodetectors.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

FIGS. 6A, 6B, 6C, 6D, 6E, and 6F illustrate an example process for forming a photodetector in the optical system of FIG. 1.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
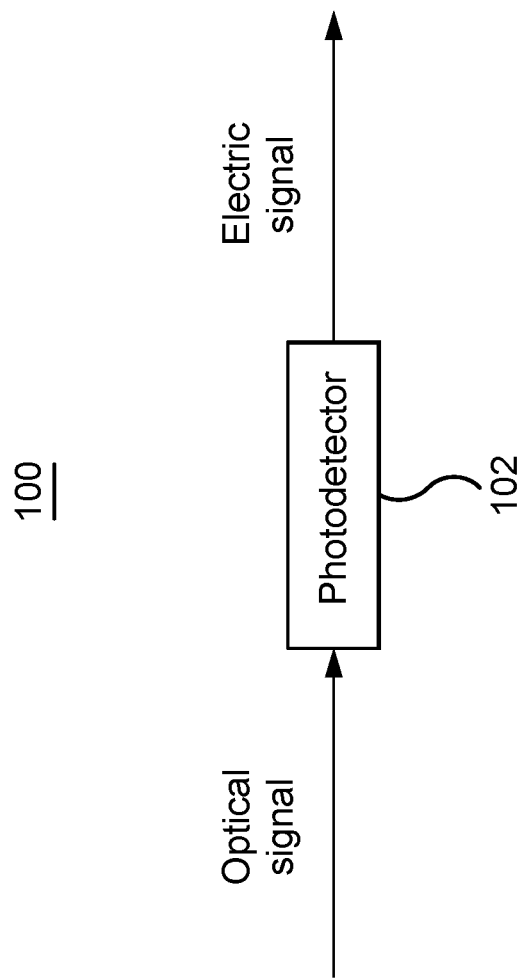
FIG. 1 illustrates an example optical system.

According to an embodiment, a photodetector includes a substrate, an absorber, a first doped region, and a second doped region. The absorber includes a first region and a second region that is more heavily doped than the first region. The first doped region is positioned on the substrate such that the first doped region contacts the second region of the absorber. A portion of the first doped region is positioned between the absorber and the substrate. The second doped region is positioned on the substrate such that the second doped region contacts the first region of the absorber rather than the second region of the absorber. A portion of the second doped region is positioned between the absorber and the substrate. The portion of the second doped region extends across a majority of a width of the absorber.

According to another embodiment, a method includes doping a substrate to form a first doped region and a second doped region in the substrate, positioning an absorber such that the absorber extends from the first doped region to the second doped region, and doping the absorber to form a first region and a second region in the absorber. The second doped region contacts the first region of the absorber rather than the second region of the absorber. A portion of the first doped region and a portion of the second doped region are positioned between the absorber and the substrate. The portion of the second doped region extends across a majority of a width of the absorber.

According to another embodiment, a photodetector includes an absorber, an anode region, and a cathode region. The absorber includes a first region and a second region that is more heavily doped than the first region. The anode region contacts the second region of the absorber. A portion of the anode region is positioned between the absorber and a substrate. The cathode region contacts the first region of the absorber rather than the second region of the absorber. A portion of the cathode region is positioned between the absorber and the substrate. The portion of the cathode region extends across a majority of a width of the absorber.

Example Embodiments

The present disclosure describes a photodetector (e.g., a Germanium (Ge) photodetector) with improved transit times, in certain embodiments. Generally, the photodetector includes an optical absorber, an anode, and a cathode. The absorber includes a more heavily doped region that contacts the anode. The anode and the cathode are formed on opposite, lateral sides of the absorber. Both the anode and the cathode also extend beneath the absorber. The cathode extends across a majority of the width of the absorber. In this manner, an electric field in the absorber is rotated to include vertical and horizontal components, which may reduce transit times in certain embodiments. For example, transit times may be improved by reducing the height of the absorber. In some embodiments, the photodetector provides improved bandwidth compared to existing devices.

FIG. 1 illustrates an example optical system 100. As seen in FIG. 1, the optical system 100 includes a photodetector 102 that converts an optical signal into an electric signal. The photodetector 102 includes an optical absorber region through which the optical signal propagates. As the optical signal propagates through the absorber region, the optical signal separates positively charged carriers (which may also be referred to as "holes") from negatively charged electrons in the absorber region. The holes and electrons may be directed through electrical components to produce the electric signal. The speed of the photodetector 102 is affected by the distance that these carriers travel to reach the electric components.

Generally, the absorber region includes a highly doped region (e.g., a highly p-doped region) that extends across a portion of the top of the absorber region. Additionally, the photodetector 102 includes a first doped semiconductor region (e.g., an anode region) and a second doped semiconductor region (e.g., a cathode region) positioned on opposite lateral sides of the absorber region. Both of the doped semiconductor regions extend beneath the absorber region, and one of the doped semiconductor regions (e.g., the cathode region) extends more than halfway across the width of the absorber region. As a result, the electric field generated in the absorber region when an optical signal passes through the absorber region has a vertical component, as opposed to being a purely horizontal electric field. The holes and electrons in the absorber region travel in opposite directions along this electric field. As a result, the distance that the carriers and electrons have to travel to reach the doped semiconductor regions may be shortened by reducing the height of the absorber region. Additionally, there may be no need to positon a metal contact on the absorber of the photodetector 102.

As seen in FIG. 1, the photodetector 102 receives an optical signal. As discussed above, the optical signal travels through an absorber region in the photodetector. The optical signal causes positively charged holes and negatively charged electrons in the absorber region to separate and travel in opposite directions. Generally, the holes travel towards the anode region in the photodetector and the electrons travel towards the cathode region in the photodetector. This movement of the holes and electrons generates an electric signal between the cathode region and the anode region and output by the photodetector 102.

In existing photodetectors, the cathode region and the anode region are disposed on opposite, lateral ends of the absorber region. As a result, the holes and electrons travel laterally in the absorber region. To reduce the travel distance of the holes and electrons, the width of the absorber region is reduced. There is a limit, however, to how small the width of the absorber may be reduced due to process limitations. Thus, there is a limit to how much the travel distance may be reduced, which limits the speed of the existing photodetectors.

In the photodetector 102, the arrangement of the absorber region, the cathode region, and the anode region causes the movement of the holes and electrons to have a vertical component. Stated differently, the arrangement of the absorber region, the cathode region, and the anode region rotates the direction of movement of the holes and electrons such that the movement includes a vertical component. As a result, the holes and electrons do not move purely laterally across the absorber region. Rather, the holes and electrons move diagonally in the absorber region. Additionally, the absorber region includes a highly doped region across a top surface of the absorber region. This highly doped region extends from one of the cathode region or the anode region towards the other region. The highly doped region does not extend fully to the other region.

To contribute to the rotation of the direction of movement of the holes and electrons, the cathode region and the anode region may be extended beneath the absorber region in the photodetector 102. Specifically, a portion of the cathode region may extend beneath the absorber region and a portion of the anode region may extend beneath the absorber region. Either the cathode region or the anode region extends more than halfway across the width of the absorber region beneath the absorber region. As a result of this extension, the movement of the holes and electrons is rotated to include a vertical component. The amount of rotation may be adjusted based on how far the cathode region or the anode region extends across the bottom surface of the absorber region.

As a result of rotating the movement of the holes and electrons such that the movement includes a vertical component, the travel distance of the holes and electrons may be reduced by reducing the height of the absorber region. Specifically, reducing the height of the absorber region may reduce the vertical component of the travel distance for the holes and electrons. Thus, reducing the height of the absorber region may improve the speed of the photodetector 102. Additionally, reducing the height of the absorber region may not be subject to the same process constraints as reducing the width of the absorber region.

Figure 2:
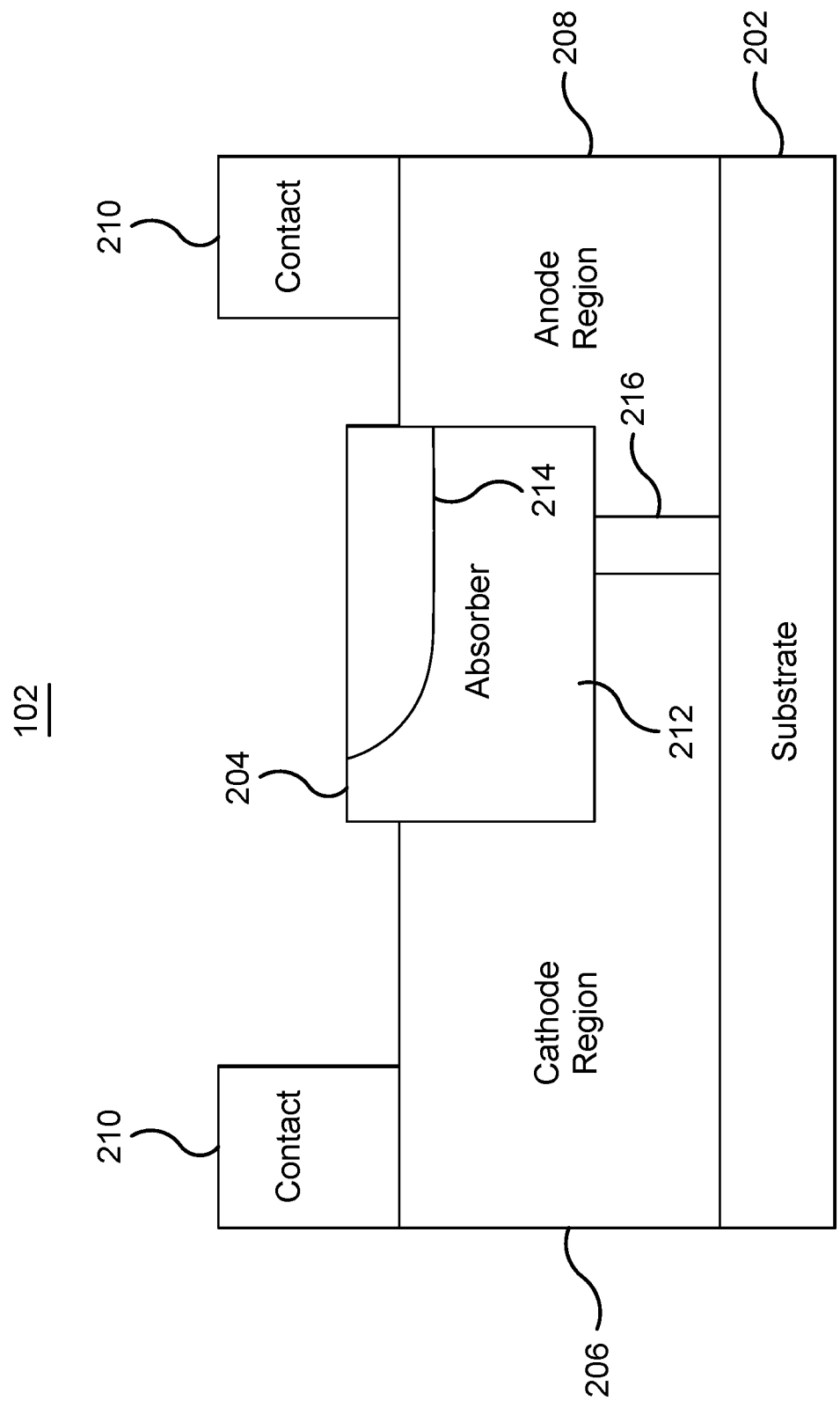
FIG. 2 illustrates an example photodetector in the optical system of FIG. 1.

FIG. 2 illustrates an example photodetector 102 in the optical system 100 of FIG. 1. As seen in FIG. 2, the photodetector 102 includes a substrate 202, an optical absorber 204, a cathode region 206, an anode region 208, and one or more contacts 210. The absorber 204, cathode region 206, and anode region 208 are arranged such that the height of the absorber 204 may be reduced to reduce the travel distance of photogenerated carriers in the absorber 204.

The substrate 202 forms a foundation for the other components of the photodetector 102. For example, the absorber 204, the cathode region 206, and the anode region 208 may be arranged on, above, or within the substrate 202. The substrate 202 may be formed using any suitable material (e.g., silicon). In some embodiments, the cathode region 206 and the anode region 208 may be formed by doping the substrate 202. The cathode region 206 and the anode region 208 may have opposite dopings to each other.

The absorber 204 may be a doped region positioned above or within the substrate 202. In the example of FIG. 2, the width of the absorber 204 is greater than or longer than the height of the absorber 204. The absorber 204 may be formed using any suitable material (e.g., germanium). For example, the substrate 202, the cathode region 206, and/or the anode region 208 may be etched to create a cavity. The absorber 204 may then be positioned in the cavity.

In some embodiments, the absorber 204 includes regions with different amounts of doping. In the example of FIG. 2, the absorber 204 includes a first region 212 with a first level of doping and a second region 214 that is more heavily doped than the first region 212. In some embodiments, the first region 212 is a Ge film and the second region 214 is a highly p-doped Ge. The second region 214 may be formed by doping a portion of the top surface of the absorber region 204 after the absorber region 204 is deposited or positioned in the cavity formed in the cathode region 206 and the anode region 208.

As seen in FIG. 2, the first region 212 forms a bottom surface of the absorber 204 and extends across the width of the absorber 204 (e.g., from one end at the cathode region 206 to the other end at the anode region 208). The second region 214 extends from one side surface or end at the anode region 208 and along a top surface of the absorber 204. The second region 214 extends across a majority of the width of the top surface of the absorber 204 but may not extend across the entire width of the absorber 204 to the cathode region 206, such that the second region 214 stops before reaching the end of the absorber 204 at the cathode region 206. The first region 212 extends across the remaining portion of the top surface. The bottom surface of the absorber 204 is closer to the substrate 202 than the top surface of the absorber 204. In some embodiments, the second region 214 establishes an equipotential plane across most of the top surface of the absorber 204 and implements a low-resistivity contact of the same plane to the anode region 208.

An optical signal may be directed through the absorber 204 to separate positively charged holes and negatively charged electrons in the absorber 204. These photogenerated carriers may then travel towards the cathode region 206 or the anode region 208 depending on their charge. The movement of the carriers to the cathode region 206 and the anode region 208 generates the electric signal produced by the photodetector 102. In certain embodiments, the design of the photodetector 102 allows the height of the absorber 204 to be reduced to reduce the travel distance of these carriers, which improves the speed of the photodetector 102.

The cathode region 206 and the anode region 208 may be positioned at opposite lateral ends of the absorber 204. Generally, the cathode region 206 and the anode region 208 may be doped regions in the substrate 202. For example, the cathode region 206 and the anode region 208 may be doped silicon regions. These doped regions may implement tunnel junctions to the film (e.g., Ge film) in the absorber 204 allowing extraction of holes and electrons. In the example of FIG. 2, the cathode region 206 contacts the first region 212 (e.g., the Ge film) of the absorber 204, and the anode region 208 contacts the first region 212 and the second region 214.

The cathode region 206 and the anode region 208 also extend beneath the absorber 204 between the absorber 204 and the substrate 202. As seen in FIG. 2, the cathode region 206 and the anode region 208 extend towards each other beneath the absorber 204. An insulator 216 is positioned beneath the absorber 204 between the absorber 204 and the substrate 202, and between the cathode region 206 and the anode region 208. The insulator 216 electrically isolates the cathode region 206 from the anode region 208. In some embodiments, the insulator 216 is an extension of the substrate 202 that was not doped when the substrate 202 was doped to form the cathode region 206 and the anode region 208. Additionally, the cathode region 206 extends across a majority of the width of the bottom surface of the absorber 204, while the anode region 208 extends across less than the majority of the width of the bottom surface of the absorber 204. In some embodiments, the arrangement of the cathode region 206 creates an equipotential plane in the region beneath and across most of the absorber 204.

As discussed previously, the extension of the cathode region 206 beneath the absorber 204 may contribute to the rotation of the movement of the holes and electrons in the absorber 204. The amount of rotation may depend on how far the cathode region 206 extends across the bottom surface of the absorber 204. For example, the vertical component of the movement may be increased by increasing how far the cathode region 206 extends across the bottom surface of the absorber 204. The vertical component of the movement may be decreased by reducing how far the cathode region 206 extends across the bottom surface of the absorber 204.

The contacts 210 may be metal electrodes formed on or in the cathode region 206 and the anode region 208. The contacts 210 carry the photogenerated carriers away from the photodetector 102. Connections may be made to the contacts 210 to receive or extract the electric signal from the photodetector 102. The contacts 210 may be formed on the cathode region 206 and the anode region 208 by depositing metal onto the cathode region 206 and the anode region 208.

In some embodiments, no contact may need to be formed on the absorber 204 to improve the response speed of the photodetector 102. Rather, the arrangement of the cathode region 206, anode region 208, first region 212, and second region 214 may allow the response speed of the photodetector 102 to be improved by reducing the height of the absorber 204.

In certain embodiments, the photodetector 102 has an opposite design than the example of FIG. 2. The absorber 204 may have an n-type doping. The second region 214 may extend from the cathode region 206 and towards the anode region 208 across the top surface of the absorber 204. The second region 214 may extend across a majority of the width of the top surface of the absorber 204 but not reach the anode region 208. The cathode region 206 and the anode region 208 may extend beneath the absorber 204 between the absorber 204 and the substrate 202. The anode region 208 may extend across a majority of the width of the absorber 204.

Figure 3:
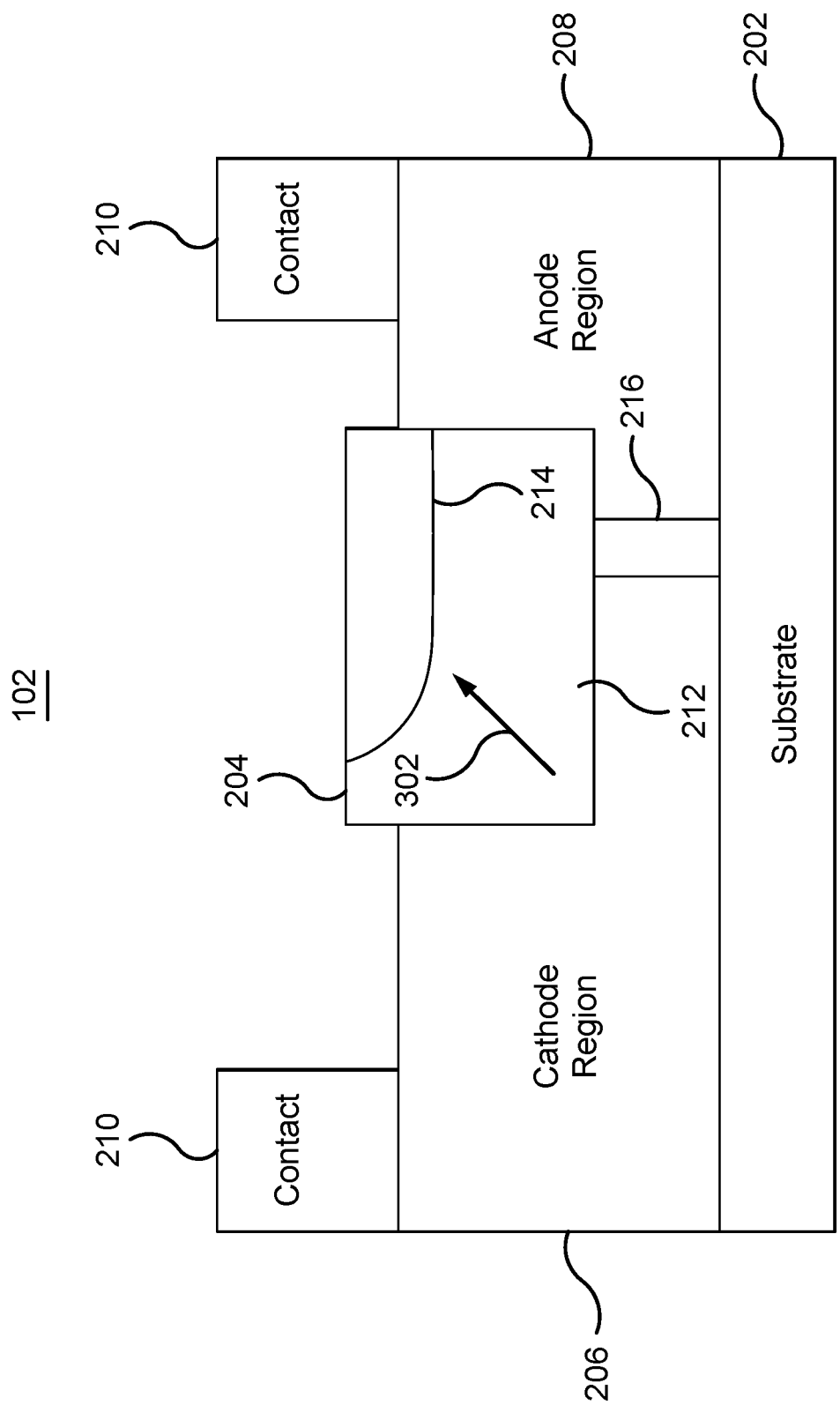
FIG. 3 illustrates an example photodetector in the optical system of FIG. 1.

FIG. 3 illustrates an example photodetector 102 in the optical system 100 of FIG. 1. As seen in FIG. 3, the photodetector 102 includes the substrate 202, the absorber 204, the cathode region 206, the anode region 208, and the contacts 210.

The absorber 204 includes the first region 212 that extends across the width of the absorber 204 from the cathode region 206 to the anode region 208. The absorber 204 also includes the second region 214 that extends from the anode region 208 towards the cathode region 206. The second region 214 extends across a majority of the width of the absorber 204 but does not reach the cathode region 206. The first region 212 may be a Ge film, and the second region 214 may be a highly p-doped region of the Ge film.

Additionally, the cathode region 206 and the anode region 208 extend beneath the absorber 204 between the absorber 204 and the substrate 202. The cathode region 206 extends across a majority of the width of the bottom surface of the absorber 204. The insulator 216 is positioned beneath the absorber 204 between the absorber 204 and the substrate 202 and between the cathode region 206 and the anode region 208. The insulator electrically isolates the cathode region 206 from the anode region 208.

When an optical signal passes through the absorber 204, an electric field 302 is generated in the absorber 204. Due to the arrangement of the cathode region 206 and the anode region 208 relative to the first region 212 and the second region 214 of the absorber 204, the electric field 302 has a vertical component and a horizontal component. In the example of FIG. 3, the electric field 302 is a diagonal electric field directed from the first region 212 towards the second region 214. The electric field 302 extends from a bottom corner of the absorber 204 near the cathode region 206 towards the second region 214. In some embodiments, extending the cathode region 206 closer towards the anode region 208 beneath the absorber 204 may increase the rotation of the electric field 302. The vertical component of the electric field 302 may be adjusted by adjusting how far the cathode region 206 extends towards the anode region 208. The holes and electrons in the absorber 204 may move in opposite directions along the electric field 302 to generate an electric signal.

In some embodiments, because the electric field 302 has a vertical component, the travel distance of the holes and electrons may be reduced by reducing the height of the absorber 204. By reducing the height of the absorber 204 and the travel distance of the holes and electrons, the speed of the photodetector 102 is increased. Additionally, reducing the height of the absorber 204 may not be subject to the same process constraints as reducing the width of the absorber 204.

Figure 4:
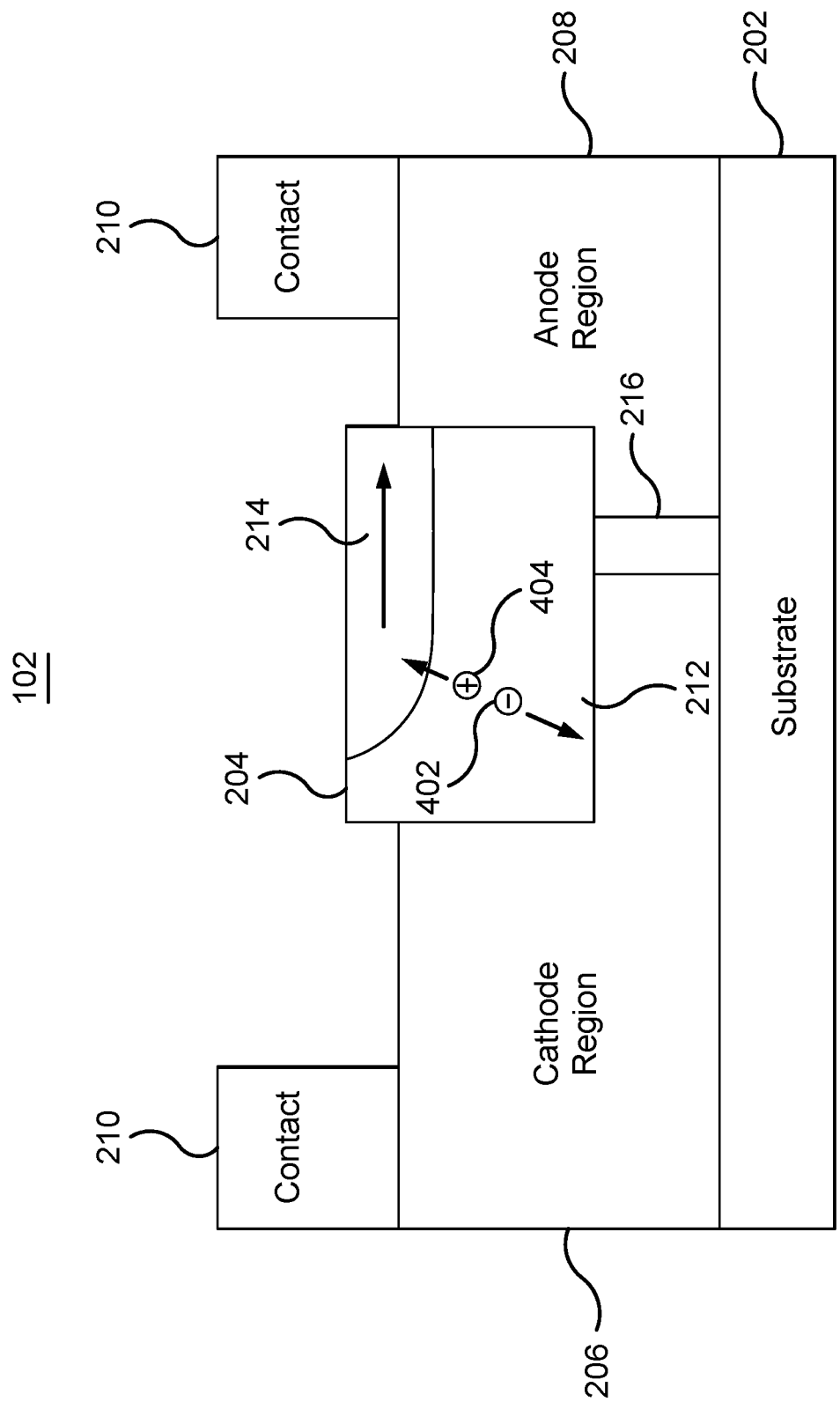
FIG. 4 illustrates an example photodetector in the optical system of FIG. 1.

FIG. 4 illustrates an example photodetector 102 in the optical system 100 of FIG. 1. As seen in FIG. 4, the photodetector 102 includes the substrate 202, the absorber 204, the cathode region 206, the anode region 208, and the contacts 210.

The absorber 204 includes the first region 212 that extends across the width of the absorber 204 from the cathode region 206 to the anode region 208. The absorber 204 also includes the second region 214 that extends from the anode region 208 towards the cathode region 206. The second region 214 extends across a majority of the width of the absorber 204 but does not reach the cathode region 206. The first region 212 may be a Ge film, and the second region 214 may be a highly p-doped region of the Ge film.

Additionally, the cathode region 206 and the anode region 208 extend beneath the absorber 204 between the absorber 204 and the substrate 202. The cathode region 206 extends across a majority of the width of the bottom surface of the absorber 204. The insulator 216 is positioned beneath the absorber 204 between the absorber 204 and the substrate 202 and between the cathode region 206 and the anode region 208. The insulator electrically isolates the cathode region 206 from the anode region 208.

When an optical signal passes through the absorber 204, negatively charged electrons 402 are separated from positively charged holes 404. As discussed with respect to FIG. 3, due to the arrangement of the cathode region 206 and the anode region 208 relative to the first region 212 and the second region 214 of the absorber 204, a diagonal electric field 302 is generated in the absorber 204. The electrons 402 and the holes 404 travel in opposite directions along the diagonal electric field 302. The electrons 402 travel towards the cathode region 206, and the holes 404 travel towards the second region 214 and towards the anode region 208. The electrons 402 may travel through the cathode region 206 to the contact 210 disposed on the cathode region 206. The holes 404 may travel to the second region 214 and into the anode region 208. The holes 404 may then travel through the anode region 208 and to the contact 210 disposed on the anode region 208. Thus, the movement of the electrons 402 and the holes 404 generates an electric signal between the cathode region 206 and the anode region 208.

In contrast to existing photodetectors, the electrons 402 and the holes 404 do not move only horizontally across the absorber 204 towards the cathode region 206 or the anode region 208. Rather, the electrons 402 and the holes 404 have a vertical component in their movement. As a result, the distance that the electrons 402 and the holes 404 travel may be reduced by reducing the height of the absorber 204, which may not be subject to the same process limitations as reducing the width of the absorber 204. Thus, the photodetector 102 may be more responsive and faster than existing devices that include absorbers with widths comparable to the width of the absorber 204.

Figure 5:
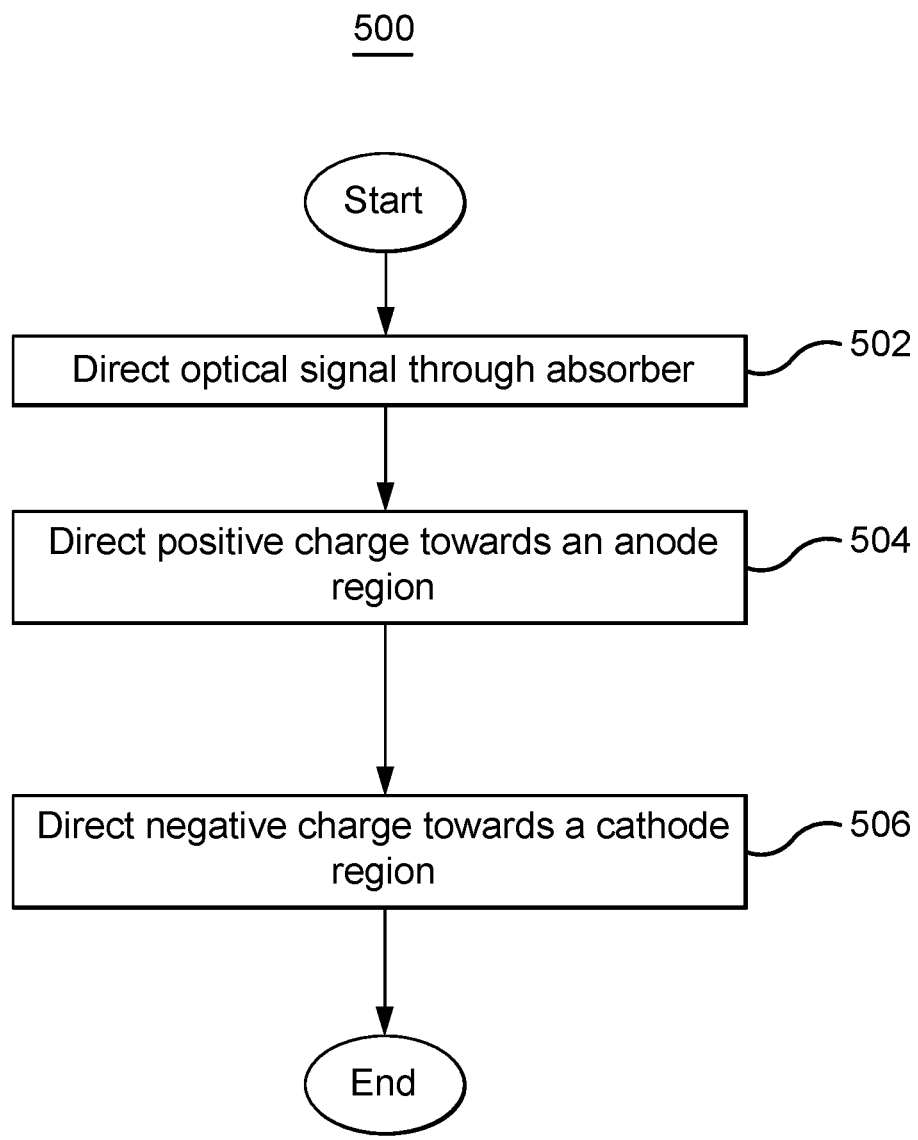
FIG. 5 is a flowchart of an example method performed in the optical system of FIG. 1.

FIG. 5 is a flowchart of an example method 500 performed in the optical system 100 of FIG. 1. In particular embodiments, the photodetector 102 performs the method 500. By performing the method 500, the photodetector 102 may produce an electric signal from a received optical signal.

In block 502, the photodetector 102 directs an optical signal through the absorber 204 of the photodetector 102. A waveguide or other medium may carry the optical signal to the photodetector 102. The waveguide or medium may be optically coupled to the photodetector 102 such that the optical signal is directed towards the absorber 204. The optical signal travels to and through the absorber 204. When the optical signal travels through the absorber 204, the optical signal may separate negatively charged electrons 402 from positively charged holes 404 in the absorber 204.

In block 504, the photodetector 102 directs the positively charged holes 404 towards the anode region 208 of the photodetector 102. The absorber 204 includes a first region 212 and a second region 214 that is more highly doped than the first region 212. The first region 212 extends across a bottom surface of the absorber 204 from the cathode region 206 to the anode region 208. The second region 214 extends from the anode region 208 towards the cathode region 206 along the top surface of the absorber 204. The second region 214 extends across a majority of the width of the top surface of the absorber 204, and the first region 212 extends across the remainder of the top surface of the absorber 204.

The cathode region 206 and the anode region 208 extend beneath the absorber 204 between the absorber 204 and the substrate 202. The insulator 216 may be positioned between the cathode region 206 and the anode region 208 beneath the absorber 204 to electrically isolate the cathode region 206 from the anode region 208. The cathode region 206 may extend across a majority of the width of the absorber 204. Due to the arrangement of the cathode region 206, the anode region 208, the first region 212, and the second region 214, the positively charged holes 404 in the absorber 204 are directed towards the anode region 208 in a diagonal direction. Stated differently, the movement of the holes 404 has a vertical component in addition to a horizontal component. In some embodiments, the holes 404 travel to the second region 214 at the top surface of the absorber 204 and then to the anode region 208.

In block 506, the photodetector 102 directs negatively charged electrons 402 in the absorber 204 towards the cathode region 206 of the photodetector 102. Due to the arrangement of the cathode region 206, the anode region 208, the first region 212, and the second region 214, the electrons 402 in the absorber 204 are directed towards the cathode region 206 in a diagonal direction. The movement of the electrons 402 has a vertical component in addition to a horizontal component.

In certain embodiments, because the movement of the electrons 402 and the holes 404 in the absorber 204 have a vertical component, the distance that the electrons 402 and the holes 404 travel to reach the cathode region 206 or the anode region 208 may be reduced by reducing a height of the absorber 204, which may not be subject to the same process constraints as reducing the width of the absorber 204. Thus, the photodetector 102 may have a faster response time than existing devices.

Figure 6B:
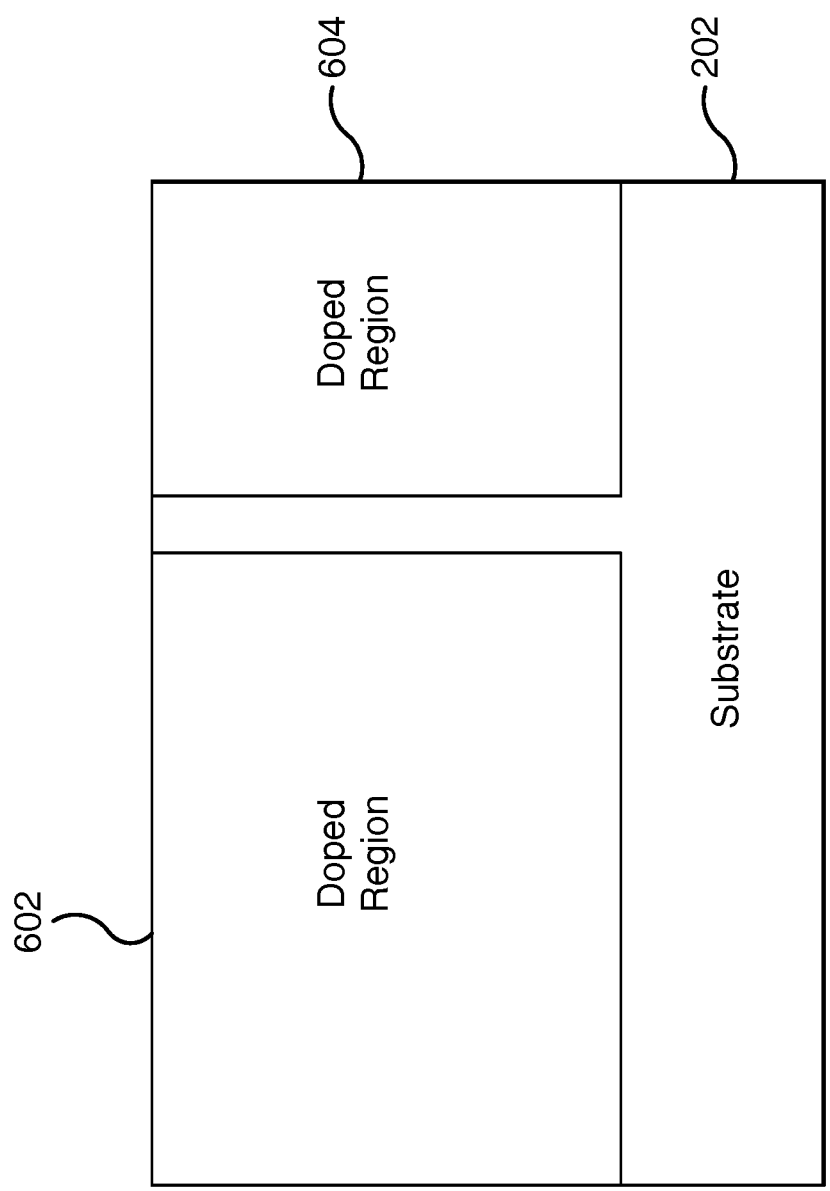

FIGS. 6A, 6B, 6C, 6D, 6E, and 6F illustrate an example process for forming the photodetector 102 in the optical system 100 of FIG. 1. As seen in FIG. 6A, the process begins with a substrate 202. The substrate 202 may be formed using any suitable material (e.g., silicon). As seen in FIG. 6B, a top portion of the substrate is doped to form doped regions 602 and 604. The doped region 602 may have an opposite doping to the doped region 604. For example, the doped region 602 may have an n-type doping, and the doped region 604 may have a p-type doping. A portion of the substrate 202 between the doped regions 602 and 604 remains undoped and may serve as an insulator.

Figure 6C:
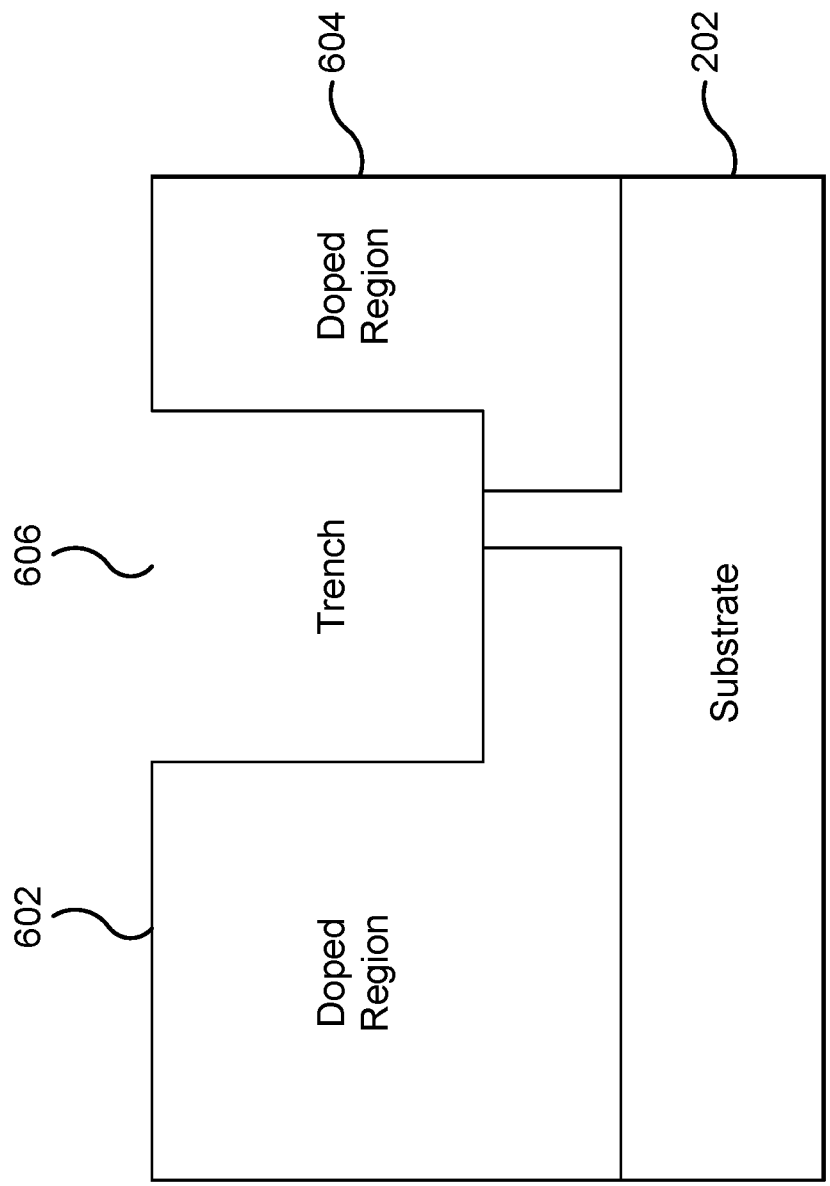

As seen in FIG. 6C, after the doped regions 602 and 604 are formed, a trench 606 is etched into the doped regions 602 and 604. Part of the undoped portion of the substrate 202 may also be etched to form the trench 606. The trench 606 extends into the doped regions 602 and 604, but not all the way through the doped regions 602 and 604. Portions of the doped regions 602 and 604 remain beneath the trench 606 between the trench 606 and the substrate 202. The portion of the doped region 602 that extends beneath the trench 606 may extend at least a majority of the width of the bottom surface of the trench 606.

Figure 6D:
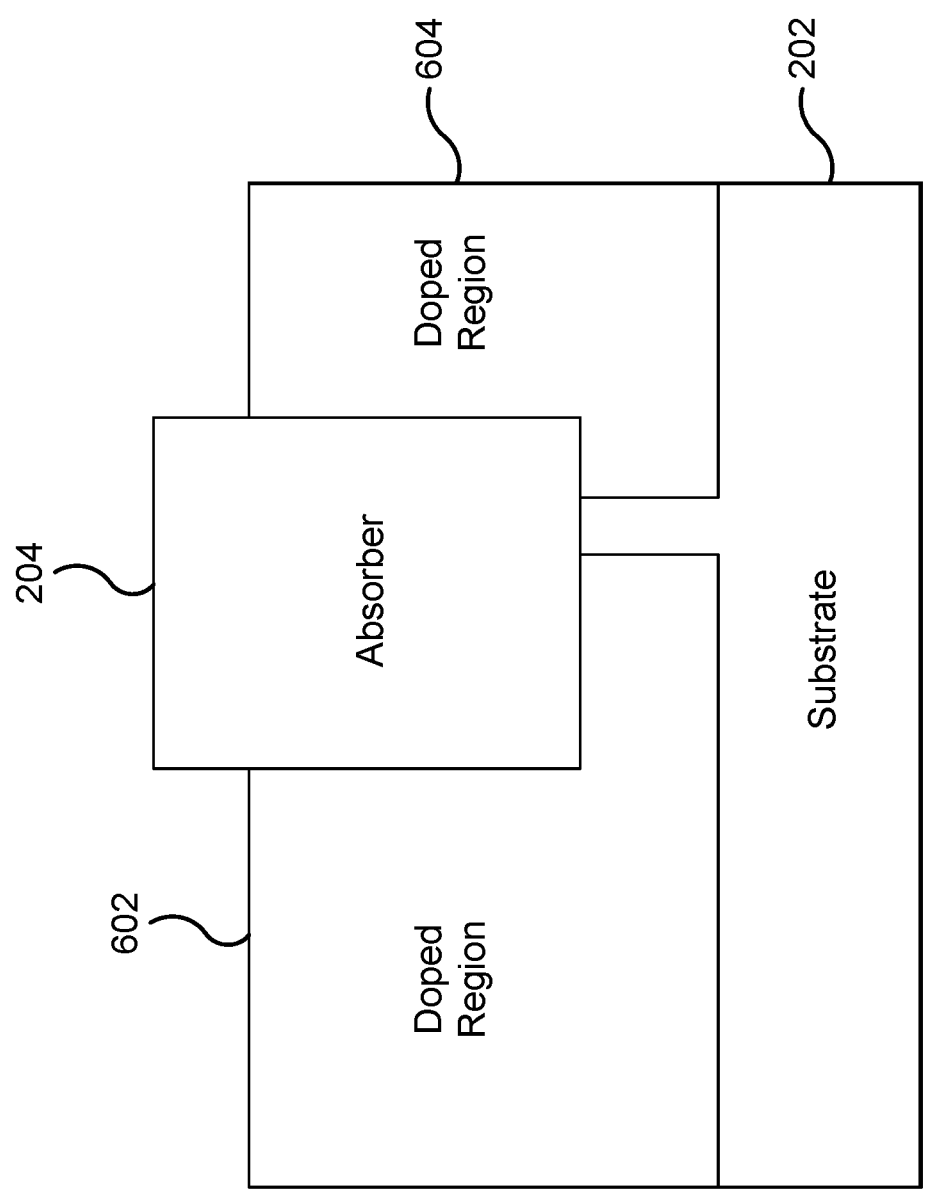
Figure 6E:
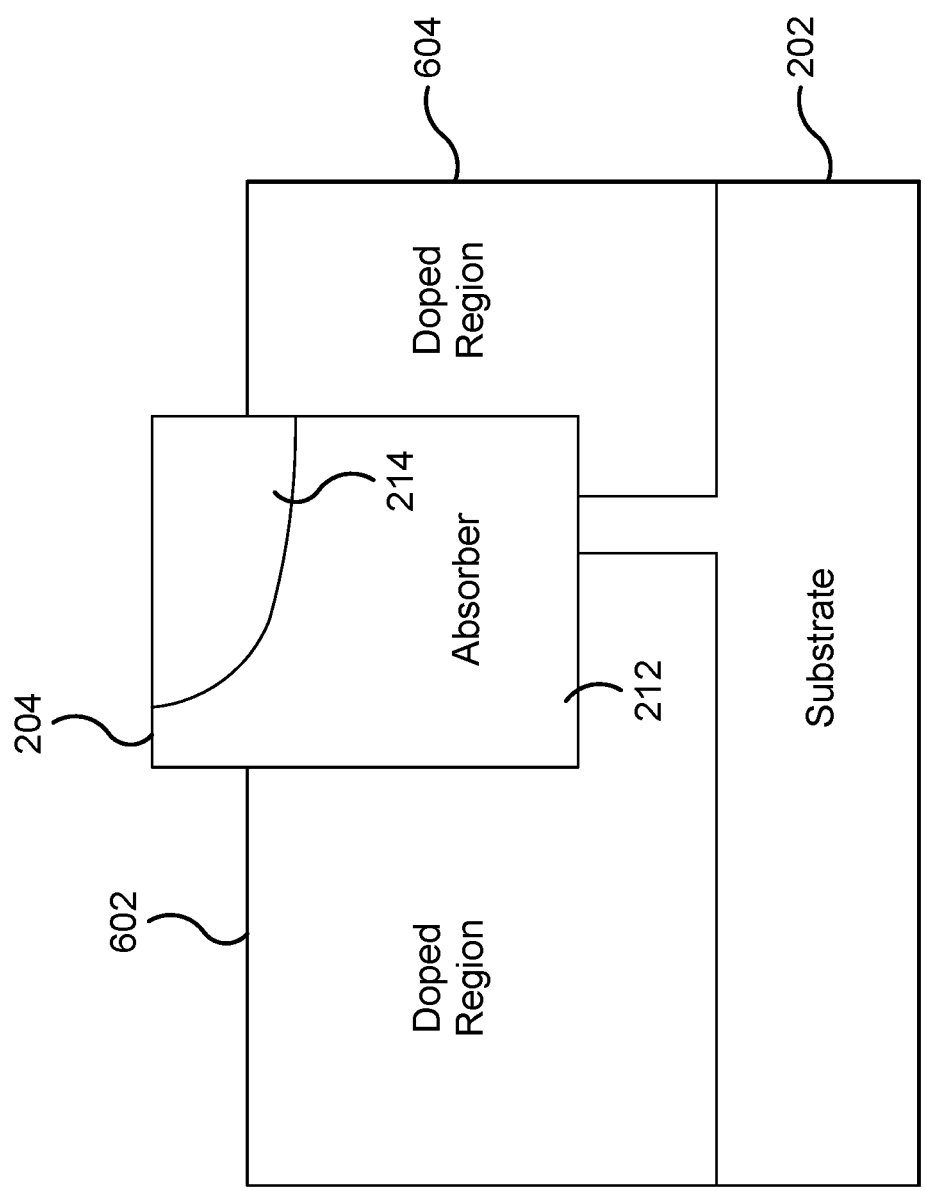
Figure 6F:
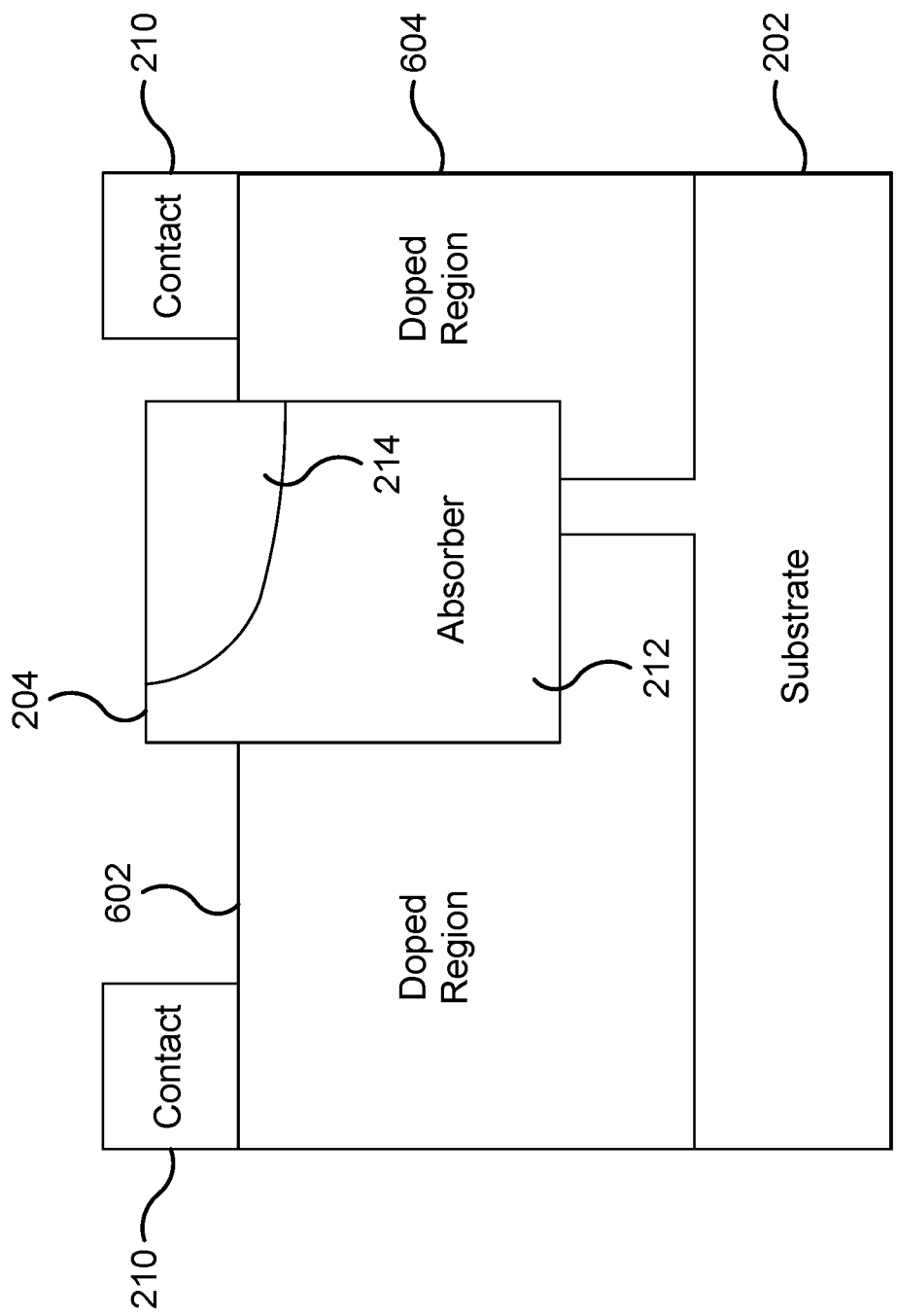

As seen in FIG. 6D, the absorber 204 is positioned into the trench 606 such that the absorber 204 is positioned between the doped region 602 and the doped region 604. As seen in FIG. 6E, a portion of the absorber 204 is then doped to create the first region 212 and the more highly doped second region 214. The first region 212 contacts the doped region 602 and the doped region 604. The second region 214 contacts the doped region 604 but not the doped region 602. The second region 214 extends from the doped region 604 towards the doped region 602 across the top surface of the absorber 204. The second region 214 extends across a majority of the top surface of the absorber 204 but stops before reaching the doped region 602. Additionally, the doped region 602 extends beneath the absorber 204 across a majority of the width of the bottom surface of the absorber 204. The undoped portion of the substrate between the doped region 602 and the doped region 604 may be the insulator 216 that electrically isolates the doped region 602 from the doped region 604. The doped region 602 and the doped region 604 may be the cathode region 206 and the anode region 208. As seen in FIG. 6E, the contacts 210 are then formed on the doped region 602 and the doped region 604.

In summary, the photodetector 102 (e.g., a Ge photodetector) may have improved transit times, in certain embodiments. Generally, the photodetector 102 includes an optical absorber 204, a cathode region 206, and an anode region 208. The absorber 204 includes a more heavily doped region 212 that contacts the anode region 208. The anode region 208 and the cathode region 206 are formed on opposite, lateral sides of the absorber 204. Both the anode region 208 and the cathode region 206 also extend beneath the absorber 204. The cathode region 206 extends across a majority of the width of the absorber 204. In this manner, an electric field 302 in the absorber 204 is rotated to include vertical and horizontal components, which may reduce transit times in certain embodiments. For example, transit times may be improved by reducing the height of the absorber 204.

In the photodetector 102, the arrangement of the absorber 204, the cathode region 206, and the anode region 208 causes the movement of the holes 404 and electrons 402 to have a vertical component. Stated differently, the arrangement of the absorber 204, the cathode region 206, and the anode region 208 rotates the direction of movement of the holes 404 and electrons 402 such that the movement includes a vertical component. As a result, the holes 404 and electrons 402 do not move purely laterally across the absorber 204. Rather, the holes 404 and electrons 402 move diagonally in the absorber 204. Additionally, the absorber 204 includes a highly doped region across a top surface of the absorber 204. This highly doped region extends from one of the cathode region 206 or the anode region 208 towards the other region. The highly doped region does not extend fully to the other region.

To contribute to the rotation of the direction of movement of the holes 404 and electrons 402, the cathode region 206 and the anode region 208 may be extended beneath the absorber 204 in the photodetector 102. Specifically, a portion of the cathode region 206 may extend beneath the absorber 204 and a portion of the anode region 208 may extend beneath the absorber 204. Either the cathode region 206 or the anode region 208 extends more than halfway across the width of the absorber 204 beneath the absorber 204. As a result of this extension, the movement of the holes 404 and electrons 402 is rotated to include a vertical component. The amount of rotation may be adjusted based on how far the cathode region 206 or the anode region 208 extends across the bottom surface of the absorber region.

As a result of rotating the movement of the holes 404 and electrons 402 such that the movement includes a vertical component, the travel distance of the holes 404 and electrons 402 may be reduced by reducing the height of the absorber 204. Specifically, reducing the height of the absorber 204 may reduce the vertical component of the travel distance for the holes 404 and electrons 402. Thus, reducing the height of the absorber 204 may improve the speed of the photodetector 102. Additionally, reducing the height of the absorber 204 may not be subject to the same process constraints as reducing the width of the absorber 204.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," or "at least one of A or B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In view of the foregoing, the scope of the present disclosure is determined by the claims that follow.

We claim:

1. A photodetector comprising:
a substrate;
an absorber comprising a first region, a second region that is more heavily doped than the first region, a first end, and a second end opposite the first end, wherein the second region extends from the first end towards the second end and extends across a majority of a width of the absorber;
a first doped region positioned on the substrate such that the first doped region contacts the first end and the second region of the absorber, wherein a portion of the first doped region is positioned between the absorber and the substrate; and
a second doped region positioned on the substrate such that the second doped region contacts the second end and the first region of the absorber rather than the second region of the absorber, wherein a portion of the second doped region is positioned between the absorber and the substrate, and wherein the portion of the second doped region extends across a majority of a width of the absorber.

2. The photodetector of claim 1, further comprising an insulator positioned between the portion of the first doped region and the portion of the second doped region.

3. The photodetector of claim 1, wherein the second region of the absorber stops before reaching the second end.

4. The photodetector of claim 1, wherein the absorber comprises germanium.

5. The photodetector of claim 1, wherein the absorber, the first doped region, and the second doped region, are arranged such that an electron in the absorber travels towards the second doped region.

6. The photodetector of claim 1, wherein the width of the absorber is longer than a height of the absorber.

7. The photodetector of claim 1, further comprising:
a first metal contact electrically coupled to the first doped region; and
a second metal contact electrically coupled to the second doped region.

8. A method comprising:
doping a substrate to form a first doped region and a second doped region in the substrate;
positioning an absorber such that the absorber extends from the first doped region to the second doped region; and
doping the absorber to form a first region and a second region in the absorber, wherein the absorber comprises a first end and a second end opposite the first end, wherein the first doped region contacts the first end, wherein the second doped region contacts the second end and the first region of the absorber rather than the second region of the absorber, wherein the second region of the absorber extends from the first end towards the second end and extends across a majority of a width of the absorber, wherein a portion of the first doped region and a portion of the second doped region are positioned between the absorber and the substrate, and wherein the portion of the second doped region extends across a majority of a width of the absorber.

9. The method of claim 8, further comprising etching a trench that extends from the first doped region to the second doped region.

10. The method of claim 9, wherein the absorber is positioned in the trench.

11. The method of claim 8, wherein an undoped portion of the substrate is positioned between the portion of the first doped region and the portion of the second doped region.

12. The method of claim 8, wherein the second region of the absorber stops before reaching the second end.

13. The method of claim 8, wherein the absorber comprises germanium.

14. A photodetector comprising:
an absorber comprising a first region, a second region that is more heavily doped than the first region, a first end and a second end opposite the first end, wherein the second region of the absorber extends from the first end towards the second end and extends across a majority of a width of the absorber;
an anode region contacting the first end and the second region of the absorber, wherein a portion of the anode region is positioned between the absorber and a substrate; and
a cathode region contacting the second end and the first region of the absorber rather than the second region of the absorber, wherein a portion of the cathode region is positioned between the absorber and the substrate, and wherein the portion of the cathode region extends across a majority of a width of the absorber.

15. The photodetector of claim 14, further comprising an insulator positioned between the portion of the anode region and the portion of the cathode region.

16. The photodetector of claim 14, wherein the second region of the absorber stops before reaching the second end.

17. The photodetector of claim 14, wherein the absorber comprises germanium.

* * * * *